United States Patent [19]

Starewicz et al.

[11] Patent Number: 5,136,243
[45] Date of Patent: Aug. 4, 1992

[54] APPARATUS AND ELEMENT FOR MAPPING A STATIC MAGNETIC FIELD

[75] Inventors: Piotr M. Starewicz, Plainfield, N.J.; David F. Hillenbrand, Groveland, Mass.

[73] Assignee: Resonance Research, Inc., Billerica, Mass.

[21] Appl. No.: 509,307

[22] Filed: Apr. 16, 1990

[51] Int. Cl.⁵ ............................................. G01V 3/00
[52] U.S. Cl. .................................... 324/318; 324/301
[58] Field of Search ............... 324/300, 301, 307, 308, 324/309, 316, 317, 321, 318

[56] References Cited

U.S. PATENT DOCUMENTS 4,126,823 11/1978 Dalton, Jr. ........................... 324/301
4,710,715 12/1987 Mee et al. ............................ 324/300
4,791,368 12/1988 Tsuzuki ............................... 324/301

Primary Examiner—Hezron E. Williams
Assistant Examiner—Louis M. Arana
Attorney, Agent, or Firm—Paul J. Cook

[57] ABSTRACT

Antenna means are provided for mapping a static magnetic field comprising an array of impedance matched untuned antenna elements with linear dimensions greater than several wavelengths of radio frequency used for nuclear magnetic resonance (NMR) or electron spin resonance (ESR). The antenna elements comprise one or more electrical conductors housed within and electrically insulated from a solid shield surrounding the conductor(s). The solid shield contains a void volume filled with a sample adapted for use in NMR or ESR.

23 Claims, 5 Drawing Sheets

APPARATUS AND ELEMENT FOR MAPPING A STATIC MAGNETIC FIELD

BACKGROUND OF THE INVENTION

This invention relates to a method and apparatus for characterizing and qualifying dipole and multipole magnets such as those utilized in superconducting subatomic particle accelerating or colliding apparatus including testing the magnitude, stability and homogeneity of the magnetic field of the magnets.

In superconducting subatomic particle accelerating or colliding apparatus, superconducting magnets are utilized to accelerate, focus or direct subatomic particles through a bore within the magnets and in a linear or curved path. The particles are accelerated over long distances and, in order to control the direction of particle acceleration, it is essential that the magnetic field generated by the magnets be known and well controlled. As presently constructed, the magnets comprise a magnetic flux generator such as a super-conducting coil structure assembled around a magnetically permeable metal bore tube. Correction coils positioned within or outside of the main superconducting coil and the metal bore tube are provided to compensate for magnetic field distortions caused by imperfections of design winding or placement of magnet elements and by saturation of the metal housing for the coils which surrounds the coils. In order to compensate for magnetic field inhomogeneities, the current to the trim coils must be controlled accurately. However, in order to determine the current needed for the trim coils, it is necessary to determine the nature and extent of the field inhomogeneities by mapping the static magnetic field generated by the main coils. While localized measurements at cryogenic temperatures and at high fields are possible using existing technology, characterization of homogeneity over the extended length and within the narrow bore of the magnet poses a significant challenge. At the present time mapping can be conducted with a long rotating coil, a travelling rotating coil, a planar probe array and a planar NMR array. The long rotating coil comprises a precision bobbin with extended windings and has the disadvantage of geometrical distortion of surface area. It is also difficult to control the coil since it requires rotation within the cryogenic environment. The rotating coil also effects geometrical distortion and requires extended translation within the cryogenic environment as well as requires a measurement cycle with respect to the field instability time constituent. It is also sensitive to Eddy currents and promotes temporal field instability. The planar probe arrays are also undesirable since their use require translation, the measurement cycle is long and the necessary hardware is potentially sensitive to Eddy currents under quench conditions.

Clark et al, J. Appl. Phys., 63 (8) pgs. 4185 and 4186, Apr. 15, 1988 discloses a method and apparatus for measuring the multipole moments of large bending magnets. The apparatus utilizes eight small magnetic resonance coils which are excited to effect a free induction delay signal from the nuclear or electron spin of a working substance such as protons in water or helium-3 positioned within the coils. The frequency of the delay signal is then used to calculate the multipole moments of the magnet.

In defining the multipole moments the following coordinate system is used. The Y axis is vertical, and is the direction of the large dipole field $B_o$ that bends the particle trajectories into a horizontal path. The Z axis is horizontal and along the particle trajectory; the X axis is horizontal and perpendicular to it. The circular boundary upon which the field measurements are made is centered at the origin and lies in the X-Y plane. Points on the circle (radius R) are specified by the angle $\theta$ measured counterclockwise from the Y axis. Since there are no sources of the magnetic field in this region, each cartesian component of the magnetic field $B = (B_x, B_y, B_z)$ satisfies Laplace's equation. Thus, if any component of B is specified on the boundary of a region, (the circle), it is determined throughout the region (inside the circle). The solution of this boundary value problem gives $$B_y(R,\theta) = B_o + B_o \sum_{n=1}^{\infty} R^n [b_n \cos(n\theta) - a_n \sin(n\theta)]. \quad (1)$$

The coefficients $a_n$ and $b_n$ are the multipole moments that are used for trajectory stability modeling. They are calculated using the Fourier inversion formulas:

$$b_n = \frac{1}{\pi B_o R^n} \int_0^{2\pi} B_y(R,\theta)\cos(n\theta)d\theta, \; n = 1, 2, \ldots, \quad (2)$$

$$a_n = \frac{-1}{\pi B_o R^n} \int_0^{2\pi} B_y(R,\theta)\sin(n\theta)d\theta, \; n = 1, 2, \ldots, \quad (3)$$

The frequency of the magnetic resonance precession $W_L$ is given by the magnitude of B of the magnetic field, whereas Eqs. (1)-(3) refer only to its y components. Since the field configuration of the magnets involves only very small components $B_x$ and $B_y$, and a small variation $B_o - B_y$ along the y direction, the relation between B and $W_L$ to first order in a Taylor series:

$$\begin{aligned} B &= \frac{W_L(R,\theta)}{Y} \\ &= (B_x^2 + B_y^2 + B_z^2)^{\frac{1}{2}} \simeq B_o\left(1 - \frac{(B_o - B_y)}{B_o}\right) \end{aligned} \quad (4)$$

where $W_L(R,\theta)$ is the magnetic resonance frequency at $R,\theta$ on the circle and y is the magnetic ratio of the resonant spin. Examination of Eqs. (2)-(4) shows that from a measurement of $W_L$ at all points of the boundary, the multipole coefficients are determined.

Within the framework of this approximation, only the variation of B along the y direction is measured [see Eq. 4)]. It is, nevertheless, sufficient to obtain the multipole coefficients. It does not, however, determine the orientation of the probe in the dipole field. For that, other means must be used, such as orientation via the null voltage from a Hall effect probe.

Equations, (2)-(4) imply that $W_L$ is known everywhere on the circular boundary. Since it is not practical to measure it at all points, $W_L$ is measured at a discrete number of points. For this case, one then replaces the integrals in Eqs. (2)-(4) with discrete sums. In the case of M samples at the locations R, $2\pi m/M$ with m taking integral values between 0 and $M-1$. The result is:

$$b_n = \frac{2}{M(W_L)R^n} \sum_{M=0}^{M-1} W_L\left(R, \frac{2\pi m}{M}\right)\cos\left(\frac{2\pi mn}{M}\right), \quad (5)$$

-continued $$b_n = \frac{-2}{M\langle W_L \rangle R^n} \sum_{M=0}^{M-1} W_L\left(R, \frac{2\pi m}{M}\right) \sin\left(\frac{2\pi mn}{M}\right). \quad (6)$$

where $\langle W_L \rangle$ is the average of $W_L$ over the circular boundary.

In applying Eqs. (5) and (6) it is important to make the number of probe positions M at least twice as large as the largest multipole index n to avoid the biasing that is inherent in discrete Fourier transforms. Also, going from the continuous case [Eqs. (2) and (3)] to the discrete case [Eqs. (5) and (6)] is an approximation, whose seriousness is easily modeled for a given situation.

Accordingly, it would be desirable to provide a means for measuring the magnitude, stability and homogeneity of a magnetic field which overcomes the disadvantages of the prior art particularly that which is less susceptible to distortions, avoids mechanical motion and which is largely insensitive to Eddy currents.

SUMMARY OF THE INVENTION

The present invention provides an array of impedance matched untuned antenna elements with linear dimensions greater than seveal wavelengths of radio frequency used for nuclear magnetic resonance (NMR) or electron spin resonance (ESR) observations and which are capable of operating over extended frequency ranges. The antenni have an active cross-section which is small as compared to the local transverse field inhomogeneities resulting in a transverse map integrated over the array length and the axial field inhomgeneities which can be obtained from the resonance line shape produced by each component of the antenna array. The antenna elements constituting the array comprise an electrical conductor or conductors housed within and spaced apart from a solid shield to form a void volume. The shield eliminates cross-talk between array elements and contains a sample being excited. In the case of NMR analysis, the void volume contains a sample having a non-zero spin nucleus such as helium-3 and in the case of ESR analysis, the void volume contians a composition characterized by unpaired electrons.

DESCRIPTION OF SPECIFIC EMBODIMENTS

Figure 1:
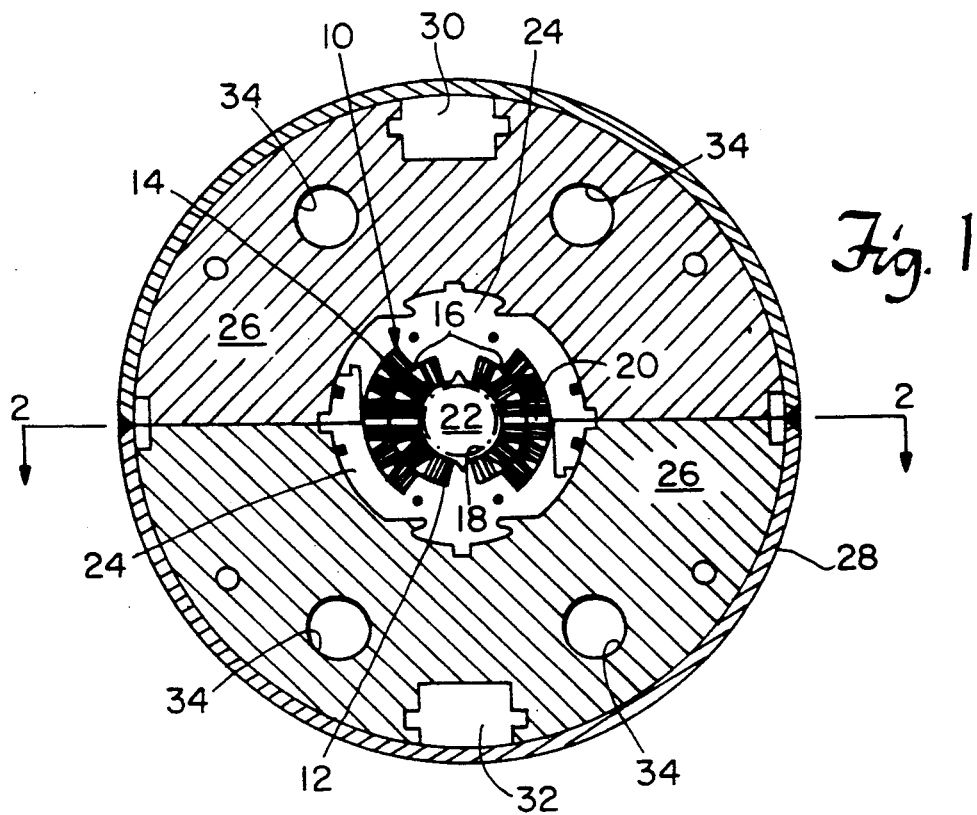
FIG. 1 is a cross-sectional view of a magnet construction suitable for mapping with the apparatus of this invention.

This invention will be described with specific reference to a magnet operated under cryogenic conditions and useful for accelerating subatomic particles. However, it is to be understood that this invention is useful for mapping the magnetic field of any magnet such as a permanent magnet or a resistive magnet.

In accordance with this invention, a magnetic field sensor is provided which is capable of performing fast, precise measurements of a magnetic field even at cryogenic temperatures using a stationary NMR or ESR antenna array capable of operation over a wide range of frequencies e.g., a magnetic field range from about 0.7 to 7 tesla (T). In use, for example in a Superconducting Super Collider (SSC) for characterizing and qualifying the dipole and multipole magnets, prior to installation, the array of elongated antenna elements is distributed about the cylindrical bore surrounded by the magnets and the array is centered and fixed within the bore. Alternatively, the array of elongated antenna elements is distributed within the magnetic field outside the magnets. In the case of NMR operation, each element of the array is filled with a composition having a non-zero spin nucleus such as proton (silicone oil, water), helium-3, fluorine-19, (chlorofluorocarbons), lithium-7 (lithium hydroxide in water) or the like. In the case of ESR operation, each element of the array is filled with a composition having stable unpaired electrons. Each element acts as a self-contained NMR or ESR sensor resonating at a frequency corresponding to its external magnetic field. Each sensing element has an active cross-section small with respect to the highest spatial frequency magnetic inhomogeneity of interest. The measurement system of this invention permits virtually instantaneous magnetic field characterization over the integrated magnet length with high transverse resolution and without the need for mechanical motion of the sensor array.

The antenni are housed within and are dielectrically spaced apart from a shield so that the void volume between the center conductor or conductors and shield can be filled with helium-3 or the like in the case of NMR or a composition having unpaired electrons in the case of ESR. Helium-3 is preferred for use in NMR at cryogenic or room temperature since it permits NMR observation at liquid helium-4 temperatures at which the SSC magnets are operated. It can be rendered to exhibit a relatively short relaxation time to permit a fast measurement cycle without saturation and it presents a single NMR line. The compositions preferred in ESR are compounds presenting a single ESR resonance such as amine oxides, e.g. tetramethyl pyridine oxide or the like. The cross-section of an antenna is small in comparison to the highest spatial frequency (angular sampling frequency) of magnetic inhomogeneity of interest. Generally useful cross sections are between about 0.4 mm$^2$ and preferably between about 1 mm$^2$ and 3 mm$^2$. The antenna can be connected to a means for energizing them such as modulated radio frequency waves and for receiving signals therefrom such as a multichannel analyzer/data logger. The antenna can be connected to impedence matched transmission lines, directly, inductively, capacitively or the like. It is preferred to utilize indirect connections in order to limit heat losses from the liquid helium cryostat when operating at cryogenic temperatures. In the preferred embodiment, the means for energizing the antenni are connected to the end of the antenni opposite from the ends to which the receiving means are connected. In addition, it is preferred to position the antenna as far away as possible from the center of the magnet bore in order to permit use of a maximum number of antenni.

By providing untuned, frequency insensitive antenni, the behavior of the magnetic field over the entire field of use of about 0.7 to 7 tesla can be determined by the apparatus of this invention. In addition, since the antenni extend along the entire length of the magnet, the entire magnetic field can be characterized without movement of the apparatus of this invention.

Figure 2:
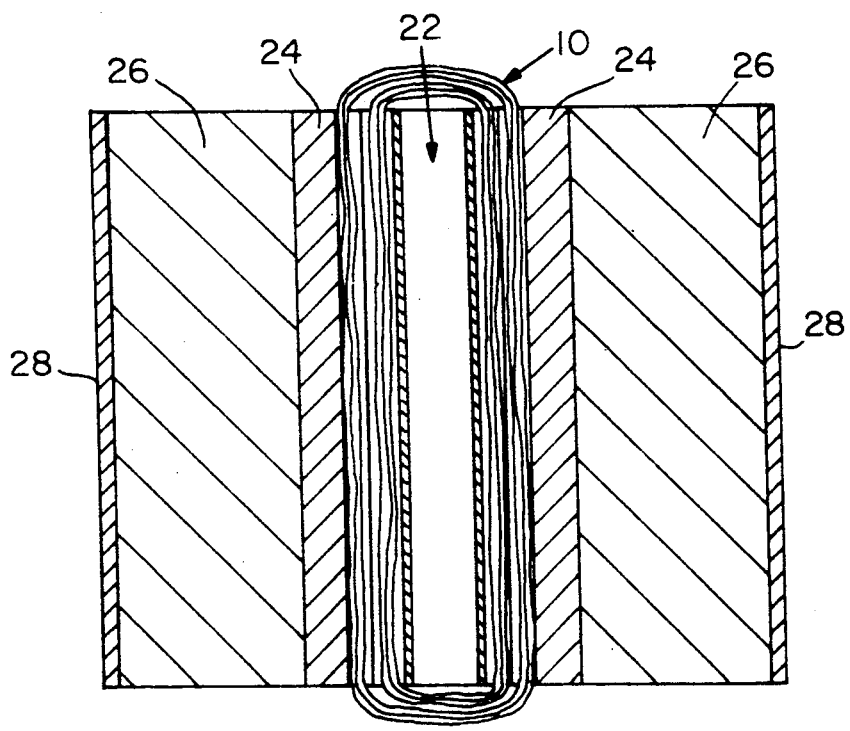
FIG. 2 is a cross-sectional view taken along line 2—2 of FIG. 1.

Referring to FIGS. 1 and 2 a cross-section of a magnet structure for a superconducting super collider (SSC) is shown. The magnet structure for the SSC is formed in sections, each about 17 meters long. The magnet portion comprises a main superconducting coil 10, which comprises two layers 12 and 14. Coil sections are seperated by wedges 16 to properly shape the coil. A trim coil 18 is positioned interior of the main coil 10 so as to compensate for distortions in the magnetic field of the main coil 10. A beam tube 20 provides a means to position the trim coil 18 and the main coil 10. The magnet void volume 22 permits insertion of the apparatus of this invention within the main superconducting coil 10 and the trim coil 18 in order to measure their resultant static magnetic field. The coils 10 and 18 are maintained in place by collars 24 and yokes 26 as well as shell 28. The yokes are provided with electrical buses 30 and 32 as well as coolant channels 34.

Figure 3:
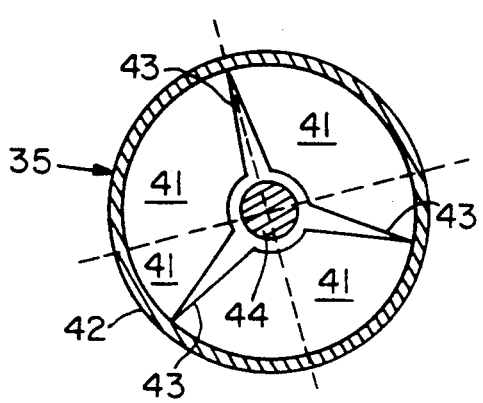
FIG. 3 is a cross-sectional view of an antenni element assembly of this invention.

An element for detecting the resonance effect of an alternating magnetic field of this invention is shown in FIG. 3. The element 40 includes a shield 42 and an electrical conductor 44 which is spaced apart from the shield 42 by spacer 43 to form void volume 41. The electrical conductor 44 extends within and along the length of spacer 43. The void volume 41 contains a detecting composition such as helium-3 in the case of NMR analysis or a composition having an atomic structure characterized by unpaired electrons in the case of ESR analysis.

Figure 4:
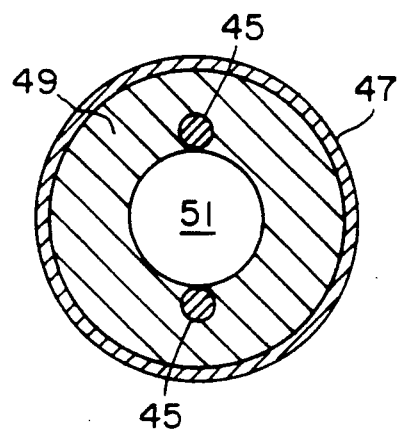
FIG. 4 is a cross-sectional view of an alternative antenni element of this invention.

As shown in FIG. 4, the element for detecting the resonance effect of an alternating magnetic field can comprise a plurality of conductors 45 housed within a shield 47 and insulated from each other by spacer 49 which is shaped to form a void volume 51 to house the detecting compositions.

Figure 5:
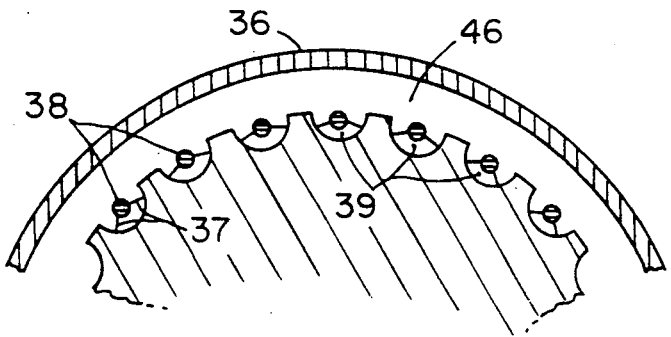
FIG. 5 is a cross-sectional view of an alternative antenni element of this invention.

An alternative detecting element of this invention is shown in FIG. 5. In this embodiment, the shield 36 can house a plurality of electrical conductors 38 so long as the electrical conductors 38 are shielded from each other to prevent cross talk by being housed within shield sections 39 by means of spacer 37. The void volume of shield sections 39 and void volume 45 contain helium-3 or a composition having unpaired electrons as set forth above. The shield 36 is formed so that the electrical conductors 38 form a closed array within the void volume 22 of the magnet 10.

Figure 6:
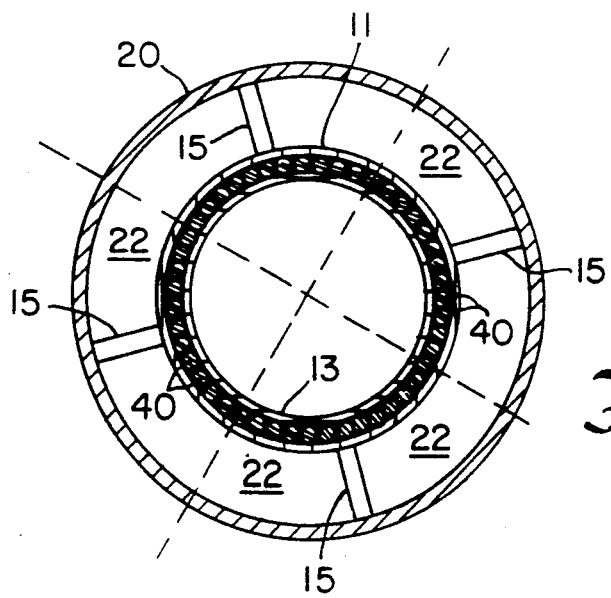
FIG. 6 is a cross-sectional view of an array of antennae elements within a magnet bore.

Referring to FIG. 6, the elements of FIG. 3 or FIG. 4 are shown positioned within the magnet void volume of the apparatus of FIGS. 1 and 2 as an array. The measuring apparatus comprises a plurality of elements 40, each comprising a shield 42 such as a nonmagnetic conductor, e.g., copper or aluminum and an electrical conductor 44 such as a copper wire. The electrical conductor 44 is spaced apart from the shield 42 by means of dielectric spacer 43. The electrical conductor 44 and spacer 43 extend along the length of the shield. Typically, the shield has a diameter between about 0.2 mm and 10 mm, preferably between about 0.3 mm and 1.0 mm. The volume 41 between the shield 42 and conductor 44 is filled either with liquid a composition having a nonzero spin nucleus or in the case of NMR analysis or with a composition having an atomic structure characterized by unpaired electrons in the case of ESR analysis. The composition is retained in place by means of end seals at each end of the shield. The amount of the composition is sufficient to permit either NMR or ESR and, preferably the void volume is filled. As shown in FIG. 6, the elements can be arranged in a closed array of 360° within the magnet void volume 22 in order to map the static magnetic field generated by coils 10 and 18. The particular shape of the array is not essential but it is desirable to include as many antenni as possible. The elements 40 are held together by tubes 11 and 13 and spacers 15 within bore tube 20. As shown in FIG. 6, the elements 40 are contacting each other in order to permit maximizing the number of elements 40 within void volume 22 thereby to obtain a more accurate measurement of the static magnetic field. Also, as shown in FIG. 6, the array is preferably shaped as a circle because this maximizes the number of absolute points of measurement. However, it is to be understood that the closed array can have any shape such as elliptical, triangular, rectangular, linear, etc. as long as the array extends within the void volume 22.

Figure 7:
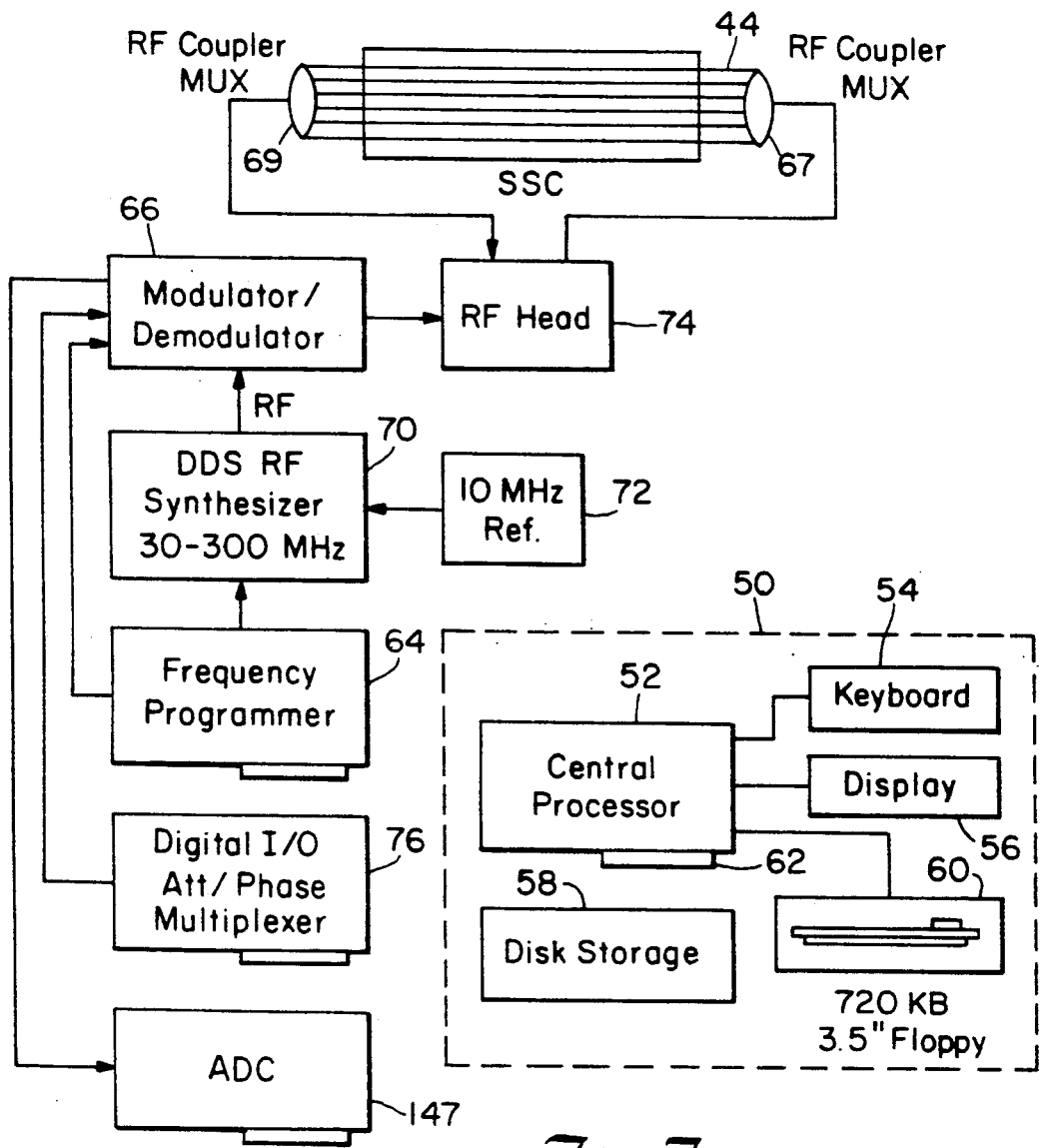
FIG. 7 is a block design of this invention.

Means for obtaining measurements of the static magnetic field are shown in FIG. 7. The control system is based upon a conventional computer system 50 that comprises a central processor 52, a keyboard 54 for certain input operations, a display 56 for output operations, a disk storage unit 58 and a floppy disk storage unit 60. The central processor unit 52 has a series of serial and parallel parts for transferring and receiving information from other elements in the system. These parts are represented by box 62 appended to central processor 52.

Control signals from the central processor 52 under program control are transferred to a frequency programmer 64. This circuit controls the various signals paths and attenuation levels within the modulator/demodulator 66 in order to appropriately establish operating parameters during the modulation and demodulation phases of the circuit 66. The computer system 50 transfers control signals to the frequency programmer 64 to control the frequency of the RF signal applied to each of the electrical conductors 44 positioned within each of the shields 42 and to establish operating conditions for transmitting an RF signal through RF coupler 67 to each of the electrical conductors 44 and receiving a signal from each of the electrical conductors 44 through RF coupling 69.

More specifically, frequency selection signals from the frequency programmer 64 control a direct digital synthesis RF frequency synthesizer 70 so that it receives a frequency reference signal from a master oscillator 72. The master oscillator 72 and the RF synthesizer 70 energize the modulator/demodulator circuit 66. These and signals from the frequency programmer 64 establish an energizing frequency that is transmitted through a multichannel RF head 74 to each of the electrical conductors 44 thereby to produce an energized pulse in each of the electrical conductors 44. When the modulator/demodulator 66 assumes a receiving mode, signals from each of the electrical conductors 40 transfer through the RF coupler 69 and multichannel RF head 74 to the modulator/demodulator 66 whereupon they are phase detected into quadrature analog signals. A pair of analog-to-digital converters 76 seperately convert the analog signals into digital format for transfer to the computer system 50. This information is then accumulated in the computer system for appropriate output to the display 56.

Figure 8:
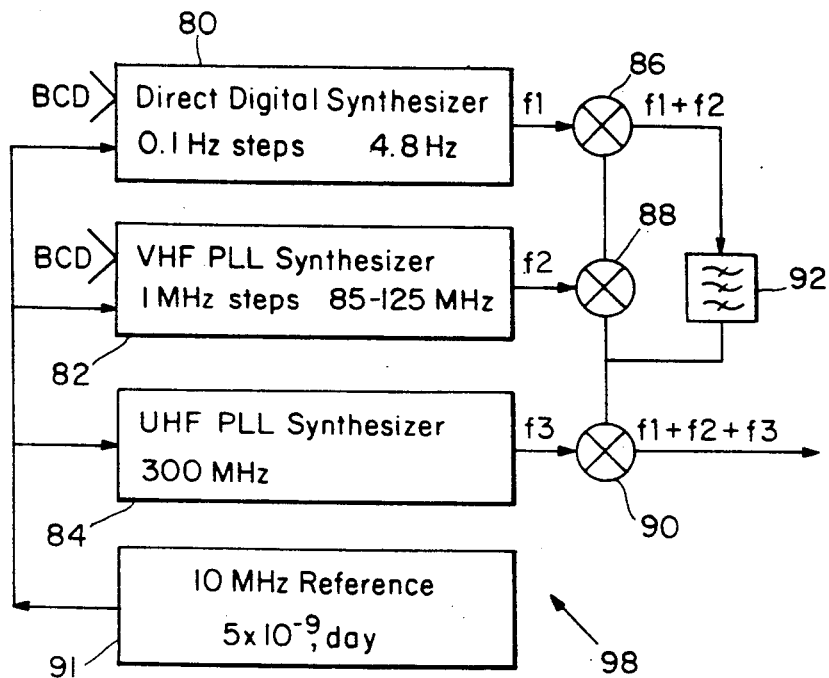
FIG. 8 is a block design useful in understanding the operation of the frequency synthesizer shown in FIG. 7.

The RF synthesizer 70 comprises three synthesizing components as shown in FIG. 8. These include a direct digital synthesizer 80, a VHF phase lock loop synthesizer 82 and a UHF phase lock loop synthesizer 84. The synthesizer 70 receives a clock signal from the clock reference 81 that controls and synchronizes the sperations of each of at the synthesizers 80, 82 and 84. In addition, control signals from the frequency programmer 64 are applied in binary coded decimal form to the synthesizer 80 and 82. The synthesizer 80 is a direct digital synthesizer that increments in steps over a limited range. In one example the synthesizer range is 30 to 300 MHZ with a step of 0.1 Hz to thereby provide a smooth shift from 30–300 MHz. The output from the synthesizer 80 is fed into a summing circuit 86.

The VHF phase lock loop synthesizer 82 produces a second set of RF signals that change over a range in discrete steps. The output from the synthesizer 82 is an output to the summing circuit 88.

A UHF phase lock loop synthesizer is constructed to produce the fixed portion of the frequency which when mixed with the sweepable part of the signal produces the $f^1+f^2+f^3$ signal.

A filter 92 connected to the output of the summing circuit 86 passes the sum of the frequencies from the synthesizers 80 and 82 to the summing circuit 88 and to the summing circuit 90. The output signal from the summing circuit 88 is then coupled as an input signal to the summing circuit 88. An input signal is directed through filter 92 to the summing circuit 90 that produces an output signal at a frequency that is the sum of the frequencies from the three synthesizers 80, 82 and 84.

Figure 9:
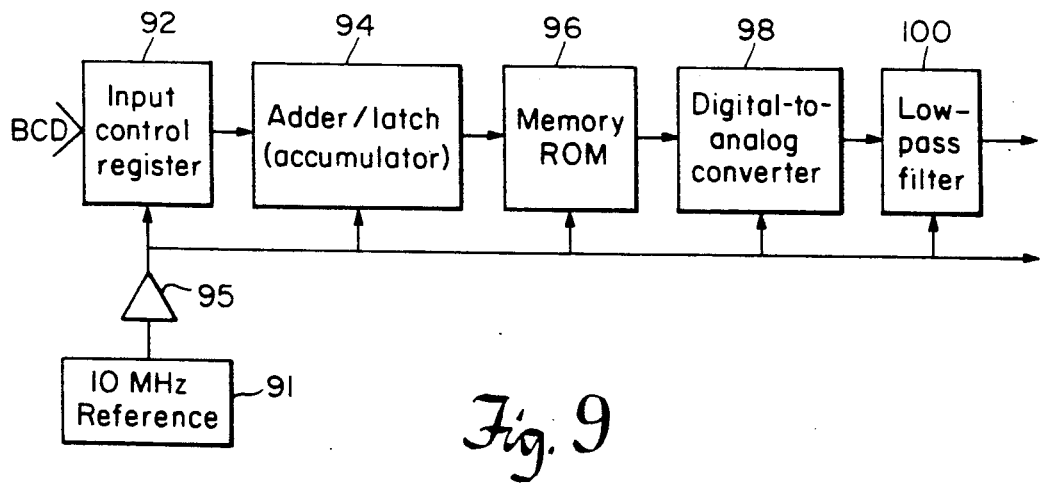
FIG. 9 is a block design useful in understanding components of the block diagram shown in FIG. 8.

The synthesizer 80 has a similar configuration as shown in FIG. 9. The corresponding binary coded decimal signals are clocked into an input control register 92 by the clocking signal from the reference, again shown in as a box 91, a buffer 94 being interposed between the reference 90 and the various components of the circuits shown in FIG. 9. Typically, the initial frequency signal will be passed from the input control registers 92 to an accumulator 94 and thereafter each successive step will increment the contents of the accumulator 94. The output from the accumulator serves as an address to a memory system 96 that produces an appropriate output for a digital-analog converter 98 with a resultant analog signal being transferred through a low pass filter 100 thereby to serve as the output signal from the synthesizer.

From the foregoing discussion, it will be obvious that the signal coming from the RF synthesizer 70 in FIG. 7 to the modulator/demodulator 66 sweeps through a wide range of frequencies to produce a phase continuous adjustment of sweep rate. Moreover, the remaining controls shown in FIG. 8, allow the sweep rate to be adjusted in rate and width. The computer system 50 allows a fast wide sweep for peak localization and then slower narrower sweeps for resonance detection and peak picking. It also allows continuous resonance observation during magnetic ramp and overcycle conditions. In one embodiment, the frequency synthesizer of FIG. 6 allows user selectable bands in the 30–300 MHz range with each band having a frequency range of 40 MHz. Phase continuous sweeps of 4 MHz are possible with a resolution of 0.1 Hz and a sweeping rate of up to 100 kHz per second.

These signals are then applied to a modulator and a base band quadrature detection demodulator 70 shown in FIG. 6. More details of this circuit are shown in FIG. 10 where two signals are combined, namely an IF clocking signal from the reference 72 shown in FIG. 7 and the RF LO signal from the RF synthesizer 91, both being shown by dash boxes in FIG. 11.

Figure 11:
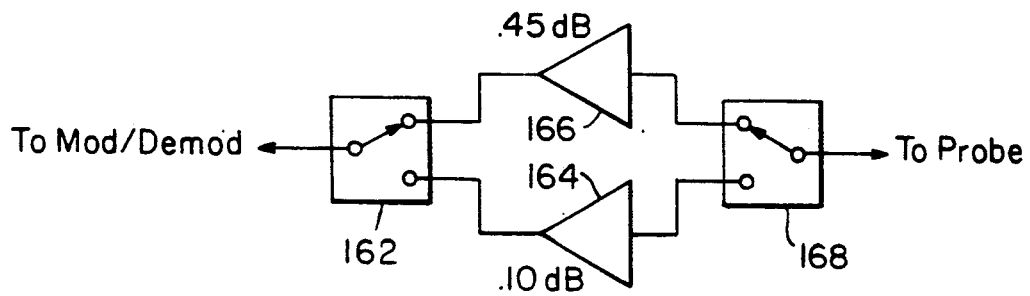
FIG. 11 is a block diagram of the radio frequency head shown in FIG. 7.

In FIG. 11, switching circuits are shown in the "receive" position. During transmissions each of these switches is shifted to the normal opened position. Moreover, a number of attenuators and other variable components are shown. The digital input/output attenuation/phase circuit 76 shown in FIG. 6 controls the settings of these components, as is well known in the art.

Figure 10:
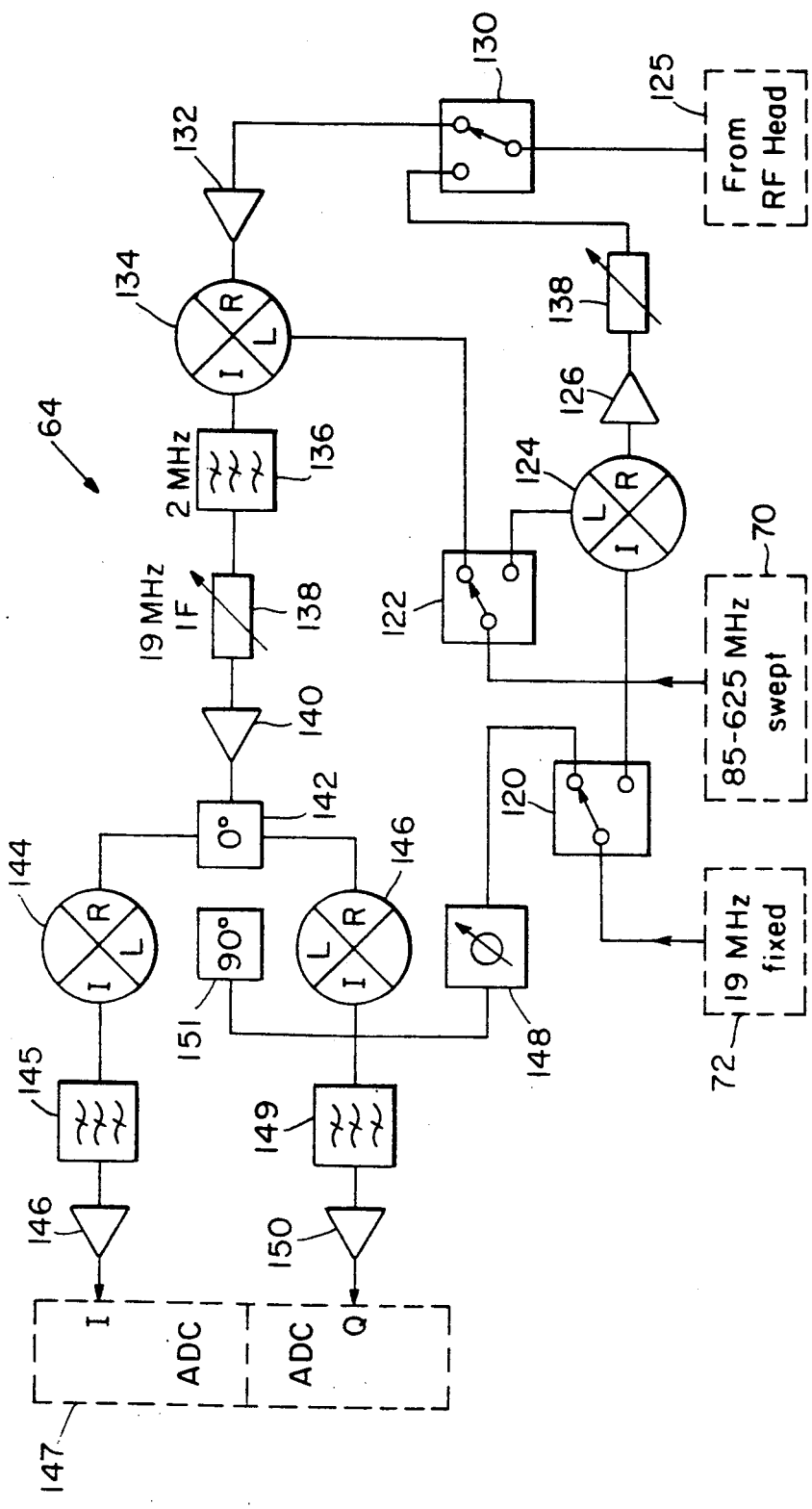
FIG. 10 is a circuit diagram of the modulator/demodulator circuit shown in FIG. 7.

Referring again to the circuits of FIG. 10, during transmission, the 19 MHz and RF frequency signals are applied through switches 120 and 122 to a modulating circuit 124. An amplifier 126, an attenuator 128 and another switch 130 convey the modulated signal to the RF head 74 shown by a dashed box 125. Thus, the RF frequency from the synthesizer 70 is mixed with the 19 mHz fixed frequency from the reference 72. The computer control assures that this modulation occurs in a short pulse and then the system terminates to return the switches 120, 122 and 130 to the condition shown in FIG. 10.

After transmission, a resonance is observed. These signals from the samples in void volume 41 in FIG. 3 are amplified in the RF head 74 and returned to a two-stage demodulator 66 through an input amplifier 132. A first demodulating stage 134 beats the sweep frequency against the incoming signal. The resulting intermediate frequency (if) signal passes through a band pass filter 136, an attenuator 138 and an amplifier 140. A 0° phase splitter 142 transfers this signal to a quadrature demodulator comprising a first demodulating section 144 and a second demodulating section 146.

The 19 MHz fixed frequency signal from the reference 91 passes through a phase shifter 148 to be applied as demodulating reference signals after passing through a 90° power splitter 150. The demodulated signal from the modulating section 144 passes through a band pass filter 145 and an amplifier 146 to be conveyed back to one of the analog-to-digital converters shown in the dashed box 147. The other signal from the demodulating section 146 passes through a band pass filter 149 and an amplifier 150 to be transferred to the other analog-to-digital converter in the circuit 147. The resulting digital signals are a measure of the frequency at which the peak appears, which in turn is a reflection of the field strength at that position due to the field produced by the static magnetic field.

FIG. 11 depicts the RF head shown in FIG. 7. This comprises a switch 162, a transmitting amplifier 164, a receiving amplifier 166 and an output switching circuit 168. During transmission, the switches 162 and 168 shift to the normally opened position so the modulated signal is transmitted through the amplifier 164. The amplifier 164 has a first gain that matches the power of the signal modulation to the power required for the electrical conductors 44. In the receiving mode the switches 162 and 168 are positioned as shown in FIG. 11 so the incoming signal is amplified in the amplifier 166 before passing to the circuit 66 in FIG. 7. The gain of the amplifier 166 is higher than the gain of the amplifier 164.

We claim:

1. An element for detecting the resonance effect of an alternating magnetic field on the orientation of nuclear magnetic polarization moments within a sample having a non zero nucleus positioned within a static magnetic field which comprises:

an electrical conductor positioned within a volume of and along the length of a solid shield formed of a nonmagnetic conductor, said solid shield being spaced apart from said conductor to form a void volume within said shield, said void volume containing said sample in an amount sufficient to permit detection of said resonance effect, means for introducing said alternating magnetic field into said solid conductor, and means for detecting nuclear resonance of said sample.

2. The element of claim 1 wherein said sample is helium-3.

3. The elements of claim 1 wherein said electrical conductor is capacitively connected to said means for detecting.

4. The element of claim 1 wherein said electrical conductor is inductively connected to said means for detecting.

5. The elements of claim 1 wherein said electrical conductor is directly connected to said means for detecting.

6. An element for detecting the resonance effect of an alternating magnetic field on the electron spin within a sample positioned within a static magnetic field which comprises:

an electrical conductor positioned within a volume of and along the length of a solid shield formed of a nonmagnetic conductor, said solid shield being spaced apart from said conductor to form a void volume within said shield, said void volume containing a composition with an atomic structure characterized by unpaired electrons in an amount sufficient to permit detection of said resonance effect, means for introducing said alternating magnetic field into said solid conductor, and means for detecting nuclear resonance of said sample.

7. The element of claim 6 wherein said composition is an amine oxide.

8. The elements of claim 6 wherein said electrical conductor is capacitively connected to said means for detecting.

9. The elements of claim 6 wherein said electrical conductor is directly connected to said means for detecting.

10. The element of claim 6 wherein said electrical conductor is inductively connected to said means for detecting.

11. The elements of any one of claims 1, 6, 2, 7, 3, 8, 4, 5, 9 or 10 wherein said means for introducing and said means for detecting are positioned at opposite ends of said electrical conductor.

12. An element for detecting the resonance effect of an alternating magnetic field on the orientation of nuclear magnetic polarization moments within a sample having a non zero spin nucleus positioned within a static magnetic field which comprises:

a plurality of electrical conductors positioned within a volume of and along the length of a solid shield, said solid shield being spaced apart from said conductors to form a void volume within said shield, and to magnetically shield each of said electrical conductors from other said electrical conductors in other of said shield, said void volume containing said sample in an amount sufficient to permit detection of said resonance effect, means for introducing said alternating magnetic field into said solid conductors, and means for detecting nuclear resonance of said sample.

13. An element for detecting the resonance effect of an alternating magnetic field on the electron spin within a sample positioned within a static magnetic field which comprises:

a plurality of electrical conductors each positioned within a volume of and along the length of a solid shield, said solid shield being spaced apart from said conductors to form a void volume within said shield, and to magnetically shield each of said electrical conductors from other said electrical conductors in other of said shield, said void volume containing said sample comprising a composition with an atomic structure characterized by unpaired electrons in an amount sufficient to permit detection of said resonance effect, means for introducing said alternating field into said solid conductors, and means for detecting electron spin resonance of said sample.

14. The elements of claim 12 wherein said solid sample is helium-3.

15. The element of claim 13 wherein said composition is an amine oxide.

16. The element of claim 12 wherein said electrical conductors are capacitively connected to said means for detecting.

17. The elements of claim 13 wherein said electrical conductors are capacitively connected to said means for detecting.

18. The element of claim 12 wherein said electrical conductors are inductively connected to said means for detecting.

19. The element of claim 13 wherein said electrical conductors are inductively connected to said means for detecting.

20. The element of claim 12 wherein said electrical conductors are directly connected to said means for detecting.

21. The element of claim 13 wherein said electrical conductor is directly connected to said means for detecting.

22. The elements of any one of claims 12, 13, 14, 15, 16, 17, 18, 19, 20 or 21 wherein said means for introducing and said means for detecting are positioned at opposite ends of said electrical conductors.

23. The apparatus of any one of claims 12, 13, 14 or 15 wherein said electrical conductors is in the form of a circle.

* * * * *